United States Patent [19]

Glass

[11] 4,293,372

[45] Oct. 6, 1981

[54] GROWTH OF SINGLE-CRYSTAL MAGNETOPLUMBITE

[75] Inventor: Howard L. Glass, Orange, Calif.

[73] Assignee: Rockwell International Corporation, El Segundo, Calif.

[21] Appl. No.: 168,927

[22] Filed: Jul. 15, 1980

[51] Int. Cl.$^3$ .................................... C30B 19/04

[52] U.S. Cl. .................................. 156/624; 423/594; 156/DIG. 74

[58] Field of Search ........ 156/624, DIG. 61, DIG. 63, 156/DIG. 70, DIG. 74, DIG. 79, DIG. 85; 252/364; 427/431; 423/594, 619, 621

[56] References Cited

PUBLICATIONS

Jonker, Journal of Crystal Growth, 28 (1975), 231–239.
Mountvala et al., Journal of the American Ceramic Society, v. 45, No. 6, pp. 285–288.
Nielson et al., J. Phys. Chem. Solids, 1958, vol. 5, pp. 202–207.
Blank et al., Journal of Crystal Growth, 17 (1972), 302–311.
Crystals for Magnetic Applications, Rooijmans-ed., Springer-Verlag, N. Y. 1978, pp. 75–78.

*Primary Examiner*—Hiram Bernstein
*Attorney, Agent, or Firm*—H. Fredrick Hamann; Gilbert H. Friedman

[57] ABSTRACT

Single crystal magnetoplumbite is grown at temperatures under 1000° C. from a fluxed melt having a selected concentration ratio of boron oxide to lead oxide and a selected concentration of iron oxide sufficient to cause magnetoplumbite to crystallize yet not so much iron oxide as will cause the melt's crystallization temperature to exceed 1000° C.

4 Claims, No Drawings

GROWTH OF SINGLE-CRYSTAL MAGNETOPLUMBITE

The invention described herein was made in the course of or under a contract or a subcontract thereunder with the Air Force.

BACKGROUND OF THE INVENTION

1. Field of the Invention

This invention relates to the growth of single-crystal magnetoplumbite in either bulk form or expitaxial form.

2. References

Nielsen et al., "The Growth of Single Crystals of Magnetic Garnets," J. Phys. Chem. Solids, 1958, Pergamon Press, Vol. 5, pp 202-207.

Blank et al., "The Growth of Magnetic Garnets by Liquid Phase Epitaxy," Journal of Crystal Growth, 1972, North-Holland Publishing Co., Vol. 17, pp 302-311.

Jonker, "Investigation of the Phase Diagram of the System $PbO-B_2O_3-Fe_2O_3-Y_2O_3$ for the Growth of Single Crystals of $Y_3Fe_5O_{12}$," Journal of Crystal Growth, 1975, North-Holland Publishing Co., Vol. 28, pp. 231-239.

Mountvala et al., "Phase Relations and Structures in the system $PbO-Fe_2O_3$," Journal of the American Ceramic Society, 1962, Vol. 45, No. 6, pp. 285-288.

All of the above-listed references are hereby incorporated by reference into this specification in their entirety.

3. Description of the Prior Art

As used herein, the term magnetoplumbite refers to the mineral $PbO-6Fe_2O_3$ and to other compounds having the same crystal structure wherein other chemical elements replace some of the iron, some of the lead or some of both the iron and lead.

Magnetoplumbite is a ferrite useful in the fabrication of electronic devices such as millimeter-wave filters and resonators. In such devices, the ferrite is required to be in single-crystal form, either bulk single crystals or in the form of epitaxial single-crystal layers grown on appropriate single-crystal substrates.

In Nielsen et al., it is shown that bulk single crystals of magnetoplumbite can be grown at relatively high temperatures from a fluxed melt consisting of lead oxide (PbO), iron oxide ($Fe_2O_3$) and a rare-earth oxide or yttrium oxide. Nielsen et al. used the crystal growth method known as "slow cooling." Their fluxed melts were held at a high temperature of from 1300° C. to 1370° C. for a few hours and then were slowly cooled at rates of from one to five degrees Celsius per hour until the desired final temperatures were reached. In some cases, the final temperature was less than 1000° C. However, in all cases, crystallization initiated at temperatures much higher than 1000° C. and all, or very nearly all, crystal growth occurred at temperatures above 1000° C. Moreover, in all cases in which magnetoplumbite crystals were obtained, YIG also crystallized. Thus, magnetoplumbite was not obtained as a single phase. Where magnetoplumbite alone is desired, further processing is required to separate the phases.

In their FIG. 7, Nielsen et al. presented a partial phase diagram suggested for the system $PbO-Y_2O_3-Fe_2O_3$ which shows a range of fluxed melt compositions from which, it is suggested, magnetoplumbite can be grown. They indicate that, because of the small amount of data obtained by them and other uncertainties in their determination, their phase diagram should be considered only "semi-quantitative.

In Blank et al., it is intimated that the diagram of Nielsen et al. is valid, at least in its general features, for $PbO-B_2O_3$ fluxes. Blank et al. were interested in growing magnetic garnets by liquid phase epitaxy, which primarily entails crystallization at temperatures below 1000° C. The Blank et al. version of the Nielsen et al. diagram includes a line labeled 1300° C. and another line labeled 950° C. The Blank et al. diagram hints at the possibility of forming single-crystal magnetoplumbite at temperatures between these two values. However, there is no discussion or description in the Blank et al. paper of these features of their phase diagram, nor is any data on magnetoplumbite crystallization presented. In fact, Blank et al. reported "no evidence of magnetoplumbite" even when the rare earth oxide ($Y_2O_3$) concentration in their melt was very low. Thus the lines marked 1300° C. and 950° C. appear to have been intended to apply only to crystallization of the garnet phase. Blank et al. imply that adding boron oxide to the fluxed melt of Nielsen et al. does not significantly change the conditions under which magnetoplumbite forms.

Jonker reported on a more detailed investigation of the $PbO-B_2O_3-Fe_2O_3-Y_2O_3$ system for the growth of single-crystal YIG at temperatures in excess of 1000° C. He studied fluxes of three different compositions distinguished by changing their $B_2O_3$:PbO molar ratios from 0.0:1 to approximately 0.0:1 to approximately 0.2:1. Included in Jonker's study were a few data points for compositions which contained no yttrium oxide ($Y_2O_3$). Jonker's crystal growth method was essentially the same slow cooling method as was used by Nielsen et al. as discussed above. Jonker used two different temperature ranges. One range started at 1275° C. with slow cooling to a final temperature of 1000° C. Jonker shows phase diagrams having lines labeled 1000° C. and other lines labeled 1100° C. These labels refer to the final temperatures of crystal growth runs. The temperature at which crystallization initiated must have been much higher. A third line in Jonkers phase diagrams is labeled 1200° C. This line is only an estimate.

In addition to the crystal growth date presented, Jonker reports differential thermal analysis (DTA) data. DTA was carried out on samples of the $PbO-B_2O_3$ fluxes containing $Fe_2O_3$ in concentrations ranging from zero to 50 mole percent in steps of ten mole percent. The DTA samples did not contain any yttrium oxide. In presenting the DTA results, Jonker defines the composition range "relevant to bulk flux growth" as $Fe_2O_3$ concentrations in the range from 20 to 50 mole percent. He further states that this composition range corresponds "to a single primary field, namely that of $PbFe_{12}O_{19}$." However, Jonker does not indicate how or whether he determined that $PbFe_{12}O_{19}$, equivalent to $PbO.6Fe_2O_3$ magnetoplumbite, actually formed. The work of Mountvala et al., as discussed below, contradicts this conclusion by Jonker. Moreover, under the experimental conditions of DTA, phases are expected to crystallize in a ceramic or polycrystalline form rather than as single crystals.

If Jonker's DTA results could be applied to single-crystal growth, then it would appear that crystallization of magnetoplumbite at temperatures below 1000° C. would be possible by using a melt having $Fe_2O_3$ concentrations near 20 mole percent. For example, based upon Jonker's FIG. 1, using $Fe_2O_3$ in a concentration of 20 mole percent and a lead oxide flux containing no boron oxide, the liquidus temperature would be 865° C. Presumably, this is the temperature at which crystallization would initiate. This result is apparently correct; but the crystallizing phase at this temperature cannot be magnetoplumbite! In this connection, see Mountvala et al., referenced above. That the crystallizing phase under the conditions set forth above cannot be magnetoplumbite is shown by the phase diagram of Mountvala et al, for the $PbO-Fe_2O_3$ system. The work of Mountvala et al., based on investigation of polycrystalline, ceramic materials, shows that there are three Pb-Fe-oxides. Besides the magnetoplumbite which Mountvala et al. denote as the $\beta$-phase, there are $\gamma$- and $\delta$-phases.

The $\delta$-phase has the composition $2PbO.Fe_2O_3$; the $\gamma$-phase is $PbO.2Fe_2O_3$ with a capacity to form solid solutions up to $PbO.2\frac{1}{2} Fe_2O_3$; the magnetoplumbite $\beta$-phase is $PbO.6Fe_2O_3$ with a capacity to form solid solutions up to $PbO.5Fe_2O_3$. It is clear from the phase diagram of Mountvala et al. that crystallization from $PbO-Fe_2O_3$ melts at temperatures below 910° C. must result in the formation of $\delta$-phase (or the formation of PbO if the $Fe_2O_3$ concentration is less than about 18 mole percent). Similarly, in the temperature range from 910° C. to 945° C., $\gamma$-phase will crystallize. If the work of Mountvala et al. is to be accepted, only at temperatures above 945° C. can magnetoplumbite crystallize. Therefore, Jonker's statement that his DTA results for 20 mole percent $Fe_2O_3$ in PbO correspond to crystallization of magnetoplumbite must be wrong. In addition, there must be serious doubts about the validity of Jonker's statement for the other data points at 20 mole percent $Fe_2O_3$, especially for the $B_2O_3:PbO$ molar ratio of 0.1 for which Jonker's liquidus temperature is 930° C.

It should be noted, as well, that none of the single-crystal prior art references (Nielsen et al., Blank et al. and Jonker) mentions any of the Pb-Fe-oxide phases other than magnetoplumbite. The other phases, $\gamma$ and $\delta$, were omitted by them since these phases do not exist at the high temperatures, greater than 1000° C., employed in their work. Similarly, PbO is not expected to crystallize at temperatures greater than 1000° C.; so crystallization of PbO is not mentioned.

In summary, the prior art indicates that single crystals of magnetoplumbite can be grown by slow cooling from a PbO or $PbO-B_2O_3$ fluxed melt at temperatures above 1000° C. Nothing in the prior art indicates that you would get magnetoplumbite when the iron oxide component of the flux is reduced enough to get crystallization below 1000° C. Moreover, the published phase diagram for the $PbO-Fe_2O_3$ system indicates that magnetoplumbite will not crystallize from the melt at temperatures below 945° C.

The prior art techniques for growing single-crystal magnetoplumbite from either a PbO flux or a $PbO-B_2O_3$ flux at temperatures at or above 1000° C. have severe limitations. Some of the limitations are due to the relatively high volatility of lead oxide. This creates problems since lead-oxide vapors are both toxic and corrosive. In addition, the considerable and continuous evaporation of lead oxide from the melt at these elevated temperatures results in continuous shifts of composition of the fluxed melt with concomitant shifts in crystal growth rate, saturation temperature, impurity incorporation and other parameters of the process. These shifts are generally undesirable since they make it difficult to control crystal growth.

In attempts to avoid the difficulties arising from the high volatility of lead oxide at the high temperatures used, the prior art has employed sealed crucibles to prevent the escape of lead oxide. However, sealed crucibles make it difficult to carry out seeded growth, especially for liquid phase epitaxy.

Furthermore, the use of high growth temperatures, above 1000° C., entails a relatively large temperature excursion in cooling the system to room temperature and therefore entails larger thermal stresses which can damage the crystals. In the case of epitaxial growth, these stresses can be particularly troublesome. Also, in epitaxial growth and some seeded growth situations, high growth temperatures exacerbate attack of the substrate by vapors and by melt. The high temperatures may also exacerbate interdiffusion between the substrate and the epitaxial layer growing thereon.

The need to sustain high temperatures raises the cost of the crystal growing process since energy consumption is high. The furnaces and other components used must be able to withstand the high temperatures. This requirement makes the equipment relatively expensive.

For all of these reasons, there is a need to provide means and methods for growing single-crystal magnetoplumbite at temperatures below 1000° C.

SUMMARY OF THE INVENTION

By means of this invention, the above-noted shortcomings of the prior art are overcome. The invention provides a fluxed melt for growing single-crystal magnetoplumbite at temperatures below 1000° C. Furthermore, the invention provides a method for growing either bulk single crystals of magnetoplumbite or epitaxial layers of single-crystal magnetoplumbite on appropriate single-crystal substrates.

In a preferred embodiment of the invention, there is provided a fluxed melt for growing single-crystal magnetoplumbite, comprising boron oxide ($B_2O_3$), lead oxide (PbO), and iron oxide ($Fe_2O_3$). The mole ratio of boron oxide to lead oxide in the melt is at least about 0.06. The concentration of iron oxide in the melt is at least about 15 mole percent but is limited to a concentration less than that which would cause the melt to have a crystallization temperature at or over 1000° C. Limited amounts of gallium oxide and aluminum oxide may be added to the melt to provide a substituent ion for the iron whereby the magnetic properties of the single-crystal material may be altered and controlled.

The use of the described fluxed melt to grow single-crystal magnetoplumbite at a temperature below 1000° C. has many advantages including: reduction of troublesome effects that are associated with evaporation of lead oxide; reduction of thermal stresses; reduction of power consumption; reduction of substrate attack; and reduction of interdiffusion when growth is carried out by epitaxial deposition on a substrate.

DETAILED DESCRIPTION

Example I

A melt was prepared having the following composition: 86.5 mole percent PbO, 5.5 mole percent $B_2O_3$, 8.0 mole percent $Fe_2O_3$. The molar ratio $B_2O_3:PbO$ is thus 0.064:1. The concentration of iron oxide is relatively low. The mixed starting materials were loaded into an open (unsealed) platinum crucible and held for about sixteen hours (overnight) at a temperature of approximately 950° C. The materials were in a molten state at this temperature. The temperature was increased to approximately 1000° C. and the melt was held at this temperature for one hour to assure complete dissolution of solids and to assure homogeneity. It was not considered necessary to go to a higher temperature to assure complete dissolution because of the relatively low concentration of iron oxide. The furnace temperature was then reduced to 900° C. A clean platinum wire was inserted into the melt to serve as a nucleation site for crystallization. While the surface of the melt was observed for evidence of crystallization, the furnace temperature was lowered in several discrete steps.

At a temperature of 743° C., no evidence of crystallization had been observed. When the furnace temperature was lowered to 718° C., the melt froze. The temperature was raised to 733° C. and the melt again became liquid. The temperature was then lowered again. With the temperature in the range from 728° C. to 733° C., crystallization occurred on the platinum wire. Standard x-ray diffraction methods showed the crystals to be lead oxide (PbO). This example confirms the phase diagram of Mountvala et al, by showing that, at relatively low concentrations of iron oxide, the phase which crystallizes is lead oxide (PbO). The flux composition of this example is therefore not suitable for growing single-crystal magnetoplumbite.

Example II

Iron oxide ($Fe_2O_3$) powder was added to the melt of Example I to increase the iron oxide concentration thereof, in steps, to values of 9.8, 11.5, 13.2 and 14.8 mole percent. After each respective addition, the temperature was increased to assure complete dissolution of all solid phases. The temperature was then lowered until crystals, formed by spontaneous nucleation, were observed on the melt surface or on a platinum wire. It was found that the temperature of crystallization, which approximates but is less than the saturation temperature, increased in proportion to the iron oxide concentration and reached a level of 793° C. for the case of 14.8 mole percent iron oxide concentration. In each case, samples of the spontaneously nucleated crystals were removed from the melt surface on a platinum wire loop. The crystals were found to be non-magnetic. The crystal morphology was not distinct but showed tetragonal or orthorhombic features. X-ray diffraction showed the crystals to be 2 $PbO.Fe_2O_3$, the $\delta$-phase.

This example shows that, as expected from the phase diagram of Mountvala et al. for some intermediate range of iron oxide concentration, the phase which crystallizes is not magnetoplumbite but the $\delta$-phase. However, for the particular values of iron-oxide concentration used in this example, that phase diagram indicates that lead oxide should crystallize. The absence of crystalline lead oxide in these results is unexpected. This deviation is believed to be due to the presence of the boron oxide in the melt. It is believed that the boron tends to keep the lead oxide in solution favoring crystallization of iron-rich phases and inhibiting the crystallization of lead-rich phases.

Example III

Iron oxide powder was added to the melt of Examples I and II to further increase the iron oxide concentration thereof, in discrete steps, to 16.3 mole percent and 17.6 mole percent, respectively. After each addition, the temperature was increased to assure complete dissolution of all solid phases.

Then the temperature was lowered until crystals, formed by spontaneous nucleation, were observed on the melt surface. As before, the temperature of crystallization was found to increase with increasing iron oxide concentration.

In the case of 17.6 mole percent concentration of iron oxide, the temperature of crystallization was observed to be 883° C. In each case, samples of the spontaneously nucleated crystals were removed from the melt surface on a platinum wire loop. The crystals were found to be magnetic. The crystal morphology was hexagonal. X-ray diffraction showed the crystals to be magnetoplumbite, $PbO.6Fe_2O_3$, the $\beta$-phase. The X-ray diffraction data showed a few, weak extra peaks. The origin of these peaks could not be determined conclusively. However, they are consistent with the presence of a small amount of $\gamma$-phase, $PbO.2Fe_2O_3$. These examples show, as expected from the phase diagram of Mountvala et al., that magnetoplumbite can be crystallized if the iron oxide concentration is sufficiently high. Moreover, if the $\gamma$-phase was in fact present, the results show, as expected from the Mountvala et al. phase diagram, the $\gamma$-phase crystallizes for iron oxide concentrations slightly higher than those for which $\delta$-phase crystallizes. However, for the particular values of iron oxide concentration of this example, the Montvala et al. phase diagram indicates that lead oxide should crystallize. The absence of crystalline lead oxide in these results is unexpected. It is believed to be due to the presence of the boron oxide in the melt for the same reason discussed in the example above.

Example IV

The iron oxide concentration of the melt of examples I, II and III was further increased, by the addition of iron oxide powder, to a value of 19.1 mole percent. The temperature was increased to assure complete dissolution of all solid phases. Then the temperature was lowered until crystals, formed by spontaneous nucleation, were observed on the melt surface. The temperature of crystallization was 933° C. Samples of the spontaneously nucleated crystals were removed from the melt surface on a platinum wire loop. The crystals were found to be magnetic. The crystal morphology was hexagonal. X-ray diffraction showed the crystals to be magnetoplumbite, $PbO.6Fe_2O_3$, the $\beta$-phase. No extra peaks were found in the X-ray data. This example shows, as expected from the Mountvala et al. phase diagram, that magnetoplumbite will crystallize if the iron oxide concentration is increased to a sufficiently high value. However, for the actual value of iron oxide concentration in the melt of this example, the Mountvala et al. phase diagram indicates that either lead oxide or the $\delta$-phase should also crystallize. This unexpected result is believed to be due to the presence of the boron oxide in the melt for the reason discussed in Example II.

Ferromagnetic resonance measurements were made at a frequency of 35 gigahertz on a spontaneously nucleated crystal grown from the melt of this example. Strong resonances were observed at fields of about 1007 and 1180 oersteds. These resonance fields are consistent with the known values of magnetization and magnetic anisotropy in magnetoplumbite. An additional weaker resonance was observed at a field of about 620 oersteds. The nature of this resonance is not known. Some additional resonances were observed at much higher fields, about 5000 oersteds. The origin of these resonances is not known.

Example V

Using the melts of examples III and IV, having iron oxide concentrations of 16.3, 17.6 and 19.1 mole percent, respectively, crystal growth was carried out on single-crystal substrates by the isothermal dipping method of liquid phase epitaxy.

For the case of the melt having 16.3 mole percent iron oxide, the growth was carried out at about 843° C. For the case of the melt having 17.6 mole percent iron oxide, the growth was carried out at about 883° C. For the case of the melt having 19.1 mole percent iron oxide, the growth was carried out at about 933° C.

Deposits were formed on single-crystal substrates of magnesium gallate spinel, $MgGa_2O_4$, magnesium indium-gallate spinel, $Mg(In,Ga)_2O_4$, and zinc gallate spinel, $ZnGa_2O_4$ spinel. The deposits were identified and their epitaxial nature established by their hexagonal morphologies and by their X-ray diffraction properties. The deposits were epitaxial magnetoplumbite.

The fluxed melts of Examples III, IV and V are thus seen to be suitable for use in the formulation of bulk single crystals of magnetoplumbite and expitaxial layers of single-crystal spinel substrates. It follows that similar fluxed melts having any iron oxide concentration in the range suggested by these examples will be similarly suitable.

Example VI

Gallium oxide ($Ga_2O_3$) powder was added to the melt described in Example IV in two discrete steps to produce gallium oxide concentrations of 0.16 and 0.38 mole percent, respectively. After each addition, the temperature was increased to assure complete dissolution of all solid phases. After the first addition was dissolved, the temperature was lowered to 933° C. and spontaneously nucleated crystals were grown on the melt surface. After the second addition of gallium oxide was dissolved, the temperature was lowered to 938° C. and spontaneously nucleated crystals were grown on the melt surface. Subsequently, spontaneously nucleated crystals were also grown at 943° C. In all cases, the spontaneously nucleated crystals were magnetic and exhibited hexagonal morphologies. X-ray diffraction measurements made on the crystals grown from both the 0.16 and 0.38 mole percent gallium oxide melts showed the crystals to be magnetoplumbite with no evidence of additional phases. Crystal growth was also carried out, for melts of both 0.16 and 0.38 mole percent gallium oxide, by the isothermal dipping method of liquid phase epitaxy. The substrates were single crystals of $MgGa_2O_4$ and $Mg(In,Ga)_2O_4$ spinel. In all cases, the deposits grown on the substrates exhibited hexagonal morphologies which showed the deposits to be epitaxial magnetoplumbite. X-ray diffraction measurements made on one of the epitaxial samples grown from the 0.35 mole percent gallium oxide melt confirmed the identification of the deposit as epitaxial magnetoplumbite.

Ferromagnetic resonance measurements were made at a frequency of 35 gigahertz on spontaneously nucleated crystals grown from these melts having gallium oxide as a constituent. Resonances were not observed at low fields. (The resonances which were observed at about 5000 oersteds in the gallium-free crystals were also observed in these crystals grown from the gallium-containing melt.)

The absence of low field resonances indicates that the anisotropy field has been increased substantially over the value for crystals grown without gallium in the melt. This was confirmed by millimeterwave power absorption measurements on a crystal grown from the melt containing 0.38 mole percent gallium oxide. Resonant absorption was observed at 50 gigahertz for a field of 3000 oersteds, 48 gigahertz for a field of 2500 oersteds and 46.8 gigahertz for a field of 2000 oersteds. Extrapolation of these results shows that, for the configuration used in the ferromagnetic resonance measurement, the anisotropy field is so large that the minimum possible resonance frequency is about 38 gigahertz. This behavior is consistent with the known effects of gallium substitution for some of the iron in ferrites such as magnetoplumbite. Thus, the ferromagnetic resonance and millimeter-wave data show that the addition of gallium oxide to the fluxed melt results in crystallization of a magnetoplumbite in which gallium substitutes for some of the iron. In a more general sense, this demonstrates that this invention can be extended to magnetoplumbite compositions in which iron is partially replaced by other cations such as, for example, aluminum.

In summary, Examples III to VI show that single-crystal magnetoplumbite can be grown from a fluxed melt comprising boron oxide ($B_2O_3$), lead oxide (PbO) and iron oxide ($Fe_2O_3$) where the mole ratio of boron oxide to lead oxide in the melt is at least about 0.06. A comparison of Example III with Examples I and II shows that the concentration of iron oxide in the melt must be greater than 14.8 mole percent or at least about 15 mole percent. As shown in Examples IV, V and VI, when the concentration of iron oxide in the melt is limited to be no more than about 20 mole percent, the crystallization temperature is under 1000° C. Example VI shows that single-crystal gallium-substituted magnetoplumbite or aluminum-substituted magnetoplumbite can be grown in a suitably modified melt at temperatures at or below 943° C.

While the invention has been shown and described with reference to certain preferred embodiments thereof, it will be understood by those skilled in the art that various changes in details may be made therein without departing from the spirit and scope of the invention as set forth in the following claims.

What is claimed is:

1. A method of growing single-crystal magnetoplumbite, comprising the steps of:
   forming a fluxed melt comprising boron oxide ($B_2O_3$), lead oxide (PbO) and iron oxide ($Fe_2O_3$), wherein the mole ratio of boron oxide to lead oxide in said melt is at least about 0.06, wherein the concentration of iron oxide in said melt is at least about 15 mole percent, and wherein the concentration of iron oxide in said melt is limited to less than that which would cause the melt to have a crystallization temperature at or over 1000° C.; and
   cooling said fluxed melt to a temperature at or below 943° C., whereby said flux will be in a supersaturated state capable of supporting the growth of single crystals of magnetoplumbite by spontaneous nucleation, by growth on seed crystal, and by growth on a single-crystal substrate placed in contact with said melt.

2. The method recited in claim 1, further comprising the step of:
   growing single crystal magnetoplumbite in an open container for said melt.

3. Single-crystal gallium-substituted or aluminum-substituted magnetoplumbite grown from a fluxed melt, wherein said fluxed melt comprises:
 boron oxide ($B_2O_3$);
 lead oxide (PbO);
 iron oxide ($Fe_2O_3$); and
 gallium oxide or aluminum oxide;
 wherein the mole ratio of boron oxide to lead oxide in said melt is at least about 0.06;
 wherein the concentration of iron oxide in said melt is at least about 15 mole percent;
 wherein the concentration of iron oxide in said melt is limited to less than that which would cause the melt to have a crystallization temperature at or over 943° C.; and
 wherein the concentration of gallium oxide or aluminum oxide in said melt does not exceed 0.4 mole percent.

4. The fluxed melt recited in claim 3, wherein the concentration of iron oxide in said melt is in the range from about 15 mole percent to about 20 mole percent.

* * * * *